(12) United States Patent
Fleissner

(10) Patent No.: US 11,322,717 B2
(45) Date of Patent: May 3, 2022

(54) OPTOELECTRONIC COMPONENT AND PROTECTIVE LAYER

(71) Applicant: PICTIVA DISPLAYS INTERNATIONAL LIMITED, Dublin (IE)

(72) Inventor: Arne Fleissner, Regensburg (DE)

(73) Assignee: PICTIVA DISPLAYS INTERNATIONAL LIMITED, Dublin (IE)

( * ) Notice: Subject to any disclaimer, the term of this patent is extended or adjusted under 35 U.S.C. 154(b) by 0 days.

(21) Appl. No.: 15/603,536

(22) Filed: May 24, 2017

(65) Prior Publication Data

US 2017/0346040 A1    Nov. 30, 2017

(30) Foreign Application Priority Data

May 24, 2016  (DE) ...................... 10 2016 109 485.4

(51) Int. Cl.
*H01L 51/52*  (2006.01)
*H01L 51/00*  (2006.01)
*H01L 51/56*  (2006.01)

(52) U.S. Cl.
CPC ...... *H01L 51/5253* (2013.01); *H01L 51/0022* (2013.01); *H01L 51/5203* (2013.01); *H01L 51/56* (2013.01)

(58) Field of Classification Search
CPC ................. H01L 51/5253; H01L 51/56; H01L 33/52–56; H01L 51/0022
See application file for complete search history.

(56) References Cited

U.S. PATENT DOCUMENTS

| 4,143,456 A | * | 3/1979 | Inoue | ..................... H01L 21/56 174/521 |
| 2005/0048411 A1 | * | 3/2005 | Leggett | .................. B82Y 30/00 430/322 |

(Continued)

FOREIGN PATENT DOCUMENTS

| DE | 102014102346 A1 | 8/2015 | |
| WO | WO-2015055766 A1 * | 4/2015 | ............. H01L 33/56 |

OTHER PUBLICATIONS

Certified JP 2015-185672 filed Sep. 18, 2015. Published in WIPO Mar. 23, 2017. (Year: 2015).*

(Continued)

*Primary Examiner* — Stephen M Bradley
(74) *Attorney, Agent, or Firm* — Botos Churchill IP Law LLP

(57) ABSTRACT

Various embodiments provide a process for producing an optoelectronic component. The process includes forming a first electrode and at least one contact section atop a carrier, forming an optically functional layer structure atop the first electrode, forming a second electrode atop the optically functional layer structure, the first electrode or the second electrode being electrically connected to the contact section, applying a protective layer to at least a subregion of the contact section, the protective layer being formed by a material which is repellent to a substance for production of an encapsulation layer, and forming the encapsulation layer atop the second electrode and atop the contact section, the subregion remaining free of the encapsulation layer because of the protective layer.

16 Claims, 3 Drawing Sheets

(56) References Cited

U.S. PATENT DOCUMENTS

| | | | |
|---|---|---|---|
| 2007/0105396 A1 | 5/2007 | Li et al. | |
| 2007/0295965 A1* | 12/2007 | Chae | H01L 29/41733 257/66 |
| 2008/0116481 A1* | 5/2008 | Sharma | H01L 21/022 257/175 |
| 2010/0157585 A1* | 6/2010 | Diekmann | F21S 6/002 362/228 |
| 2011/0032177 A1 | 2/2011 | Prat et al. | |
| 2011/0198736 A1* | 8/2011 | Shero | B82Y 30/00 257/629 |
| 2013/0194350 A1* | 8/2013 | Watanabe | H01L 21/67051 347/54 |
| 2014/0252406 A1* | 9/2014 | Baisl | H01L 51/5253 257/100 |
| 2014/0338728 A1* | 11/2014 | Cheyns | H01L 27/32 136/249 |
| 2016/0233398 A1* | 8/2016 | Farrnbacher | H01L 33/56 |
| 2016/0359130 A1 | 12/2016 | Wehlus et al. | |
| 2017/0365815 A1* | 12/2017 | Sonoda | H01L 51/50 |
| 2018/0255647 A1* | 9/2018 | Nakajima | H01L 21/768 |

OTHER PUBLICATIONS

Certified Japanese Application No. 2015-185672 (Year: 2015).*
German Search Report based on application No. 10 2016 109 485.4 (9 pages) dated May 16, 2018 (for reference purpose only).

* cited by examiner

OPTOELECTRONIC COMPONENT AND PROTECTIVE LAYER

CROSS-REFERENCE TO RELATED APPLICATION

This application claims priority to German Patent Application Serial No. 10 2016 109 485.4, which was filed May 24, 2016, and is incorporated herein by reference in its entirety.

TECHNICAL FIELD

Various embodiments relate generally to a process for producing an optoelectronic component, to an optoelectronic component and to a protective layer.

BACKGROUND

Optoelectronic components are understood in this application to mean optical electronic components that generate light by means of current, called light-emitting components, for example LEDs or OLEDs, or that generate current by means of light, called light-absorbing components, for example solar cells or light sensors.

Organic-based optoelectronic components, called organic optoelectronic components, are finding increasingly widespread use. For example, organic light-emitting diodes (OLEDs) are increasingly being used in general lighting, for example as areal light sources. An OLED may have an anode and a cathode, and an organic functional layer system in between. The organic functional layer system may have one or more emitter layers in which electromagnetic radiation is generated, a charge carrier pair-generating layer structure each composed of two or more charge carrier pair generation layers ("charge-generating layers", CGL) for charge carrier pair generation, and one or more electron blocking layers, also referred to as hole transport layers (HTL), and one or more hole blocking layers, also referred to as electron transport layers (ETL), in order to direct the current flow.

Optoelectronic components, for example the electrodes of the optoelectronic components and the intervening optically functional layers of the optoelectronic components, are regularly encapsulated in order to protect the optically functional layers and/or the electrodes from environmental influences, for example air or moisture, and hence from corrosion. Such an encapsulation ideally creates a hermetic seal of the corresponding optoelectronic component.

For example, an OLED can be encapsulated with an ALD thin-film layer by an ALD process. In the ALD process, it is regularly the case that the entire optoelectronic component is coated; more particularly, subregions of the optoelectronic component that are actually supposed to be free of any coating are coated as well. If, for example, the encapsulation layer is to be electrically insulating, contact regions for forming electrical contacts with the corresponding optoelectronic component have to be free of the encapsulation layer, in order to make it possible to form electrical contacts, for example by means of ACF bonding. Therefore, after it has been formed, the corresponding encapsulation layer has to be removed again in appropriate subregions, especially in the contact regions.

The contact regions can be exposed, for example, manually by scraping the protective layer off or by laser ablation. Apart from the need for the costly and inconvenient scraping-off or laser ablation process per se, the conventional solution is additionally also disadvantageous since the contact regions can be scraped in the case that the protective layer is scraped off, or damaged to a greater or lesser degree because of the heat that arises in laser ablation. Therefore, these processes are barely suitable, if at all, for component architectures where the corresponding metal electrode is very thin and/or where selective ablation of the ALD layer from the contact region on the corresponding metal electrode is possible only with difficulty, if at all. This is especially the case for metal contacts that have been applied by thermal vapor deposition, for example composed of aluminum. It is not possible here to directly and selectively laser-ablate the ALD layer off the metal contact; instead, there can be unwanted ablation of the metal contact that leads to failure of the component.

SUMMARY

Various embodiments provide a process for producing an optoelectronic component. The process includes forming a first electrode and at least one contact section atop a carrier, forming an optically functional layer structure atop the first electrode, forming a second electrode atop the optically functional layer structure, the first electrode or the second electrode being electrically connected to the contact section, applying a protective layer to at least a subregion of the contact section, the protective layer being formed by a material which is repellent to a substance for production of an encapsulation layer, and forming the encapsulation layer atop the second electrode and atop the contact section, the subregion remaining free of the encapsulation layer because of the protective layer.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

Figure 1:
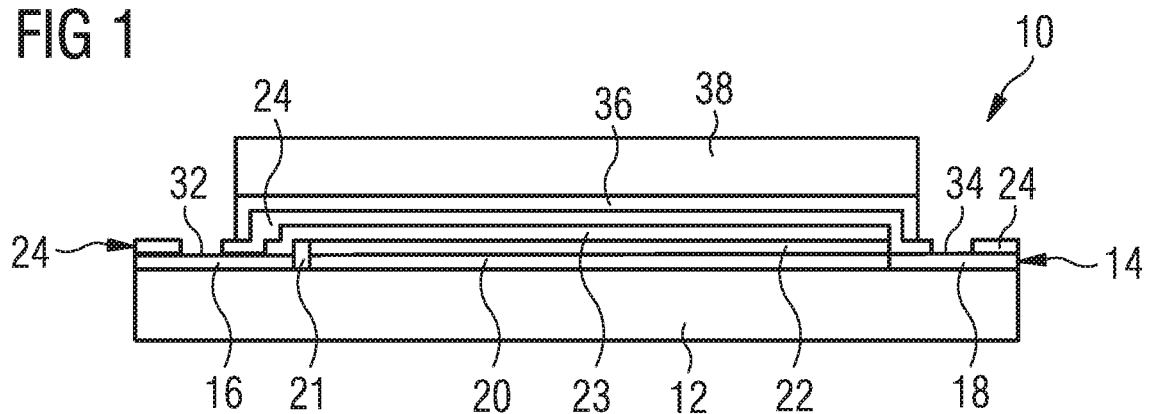
FIG. 1 shows a lateral section diagram of a working example of an optoelectronic component.

The following detailed description refers to the accompanying drawings that show, by way of illustration, specific details and embodiments in which the invention may be practiced.

A detailed description which follows makes reference to the appended drawings that form part of this description and in which specific working examples in which the invention can be executed are detailed for illustration. Since components of working examples can be positioned in a number of different orientations, the directional terminology serves for illustration and is not restrictive in any way at all. It will be apparent that other working examples can be utilized and structural or logical alterations can be undertaken without departing from the scope of protection of the present invention. It will be apparent that the features of the various working examples described herein can be combined with one another, unless specifically stated otherwise. The detailed description which follows should therefore not be interpreted in a restrictive manner, and the scope of protection of the present invention is defined by the appended claims. In the figures, identical or similar elements are given identical reference numerals if appropriate.

An optoelectronic component may be an electromagnetic radiation-emitting component or an electromagnetic radiation-absorbing component. An electromagnetic radiation-absorbing component may, for example, be a solar cell. An electromagnetic radiation-emitting component may, in various working examples, be an electromagnetic radiation-emitting semiconductor element and/or take the form of an electromagnetic radiation-emitting diode, of an organic electromagnetic radiation-emitting diode, of an electromagnetic radiation-emitting transistor or of an organic electromagnetic radiation-emitting transistor. The radiation may, for example, be light in the visible region, UV light and/or infrared light. In this connection, the electromagnetic radiation-emitting component may take the form, for example, of a light-emitting diode (LED), of an organic light-emitting diode (OLED), of a light-emitting transistor or of an organic light-emitting transistor. The light-emitting component may be part of an integrated circuit in various working examples. In addition, a multitude of light-emitting components may be provided, for example accommodated in a common housing.

FIG. 1 shows a lateral section diagram of a working example of an optoelectronic component 10. The optoelectronic component 10 has a carrier 12. The carrier 12 may be translucent or transparent. The carrier 12 serves as a carrier element for electronic elements or layers, for example light-emitting elements. The carrier 12 may, for example, include or be formed from plastic, metal, glass, quartz and/or a semiconductor material. In addition, the carrier 12 may include or be formed from a polymer film or a laminate having one or more polymer films. The carrier 12 may be mechanically rigid or mechanically flexible.

An optoelectronic layer structure is formed atop the carrier 12. The optoelectronic layer structure has an electrically conductive layer 14 having a first contact section 16, a second contact section 18 and a first electrode 20. Alternatively, the first electrode 20, the first contact section 16 and/or the second contact section 18 may be formed by different layers and/or by different materials. The carrier 12 with the electrically conductive layer 14 and especially the carrier 12 with the first electrode 20 and the two contact sections 16, 18 can also be referred to as substrate. Between the carrier 12 and the electrically conductive layer 14, a first barrier layer (not shown) may be formed, for example a first thin barrier layer.

The first electrode 20 is electrically insulated from the first contact section 16 by an electrical insulation barrier 21. The second contact section 18 is electrically coupled to the first electrode 20 of the optoelectronic layer structure. The first electrode 20 may take the form of an anode or a cathode. The first electrode 20 may be translucent or transparent. The first electrode 20 and/or the first electrode layer 14 include(s) an electrically conductive material, for example metal, for example silver, and/or a transparent conductive oxide (TCO) or a layer stack of two or more layers including metals or TCOs. The first electrode 20 may comprise, for example, a layer stack of a combination of one layer of a metal on one layer of a TCO, or vice versa. One example is a silver layer applied to an indium tin oxide (ITO) layer (Ag on ITO) or ITO-Ag-ITO multilayers. The first electrode 20 may, alternatively or additionally to the materials mentioned, include: networks of metallic nanowires and -particles, for example of Ag, networks of carbon nanotubes, graphene particles and graphene layers and/or networks of semiconductive nanowires. The contact sections 16, 18 may, for example, include metal or be formed by metal. For example, the contact sections 16, 18 may each have a layer stack composed of different metals, for example one chromium/aluminum/chromium layer stack each.

An optically functional layer structure, for example an organic functional layer structure 22, of the optoelectronic layer structure has been formed atop the first electrode 20. The organic functional layer structure 22 may have one, two or more sublayers, for example. For example, the organic functional layer structure 22 may have a hole injection layer, a hole transport layer, an emitter layer, an electron transport layer and/or an electron injection layer. The hole injection layer serves to reduce the band gap between the first electrode and hole transport layer. In the hole transport layer, the hole conductivity is greater than the electron conductivity. The hole transport layer serves to transport the holes. In the electron transport layer, the electron conductivity is greater than the hole conductivity. The electron transport layer serves to transport the electrons. The electron injection layer serves to reduce the band gap between a second electrode 23 and the electron transport layer. In addition, the organic functional layer structure 22 may have one, two or more functional layer structure units, each of which have sublayers mentioned and/or further interlayers.

The second electrode 23 of the optoelectronic layer structure which is formed atop the organic functional layer structure 22 is electrically coupled to the first contact section 16. The second electrode 23 may be in accordance with one of the configurations of the first electrode 20, and the first electrode 20 and the second electrode 23 may be the same or different. The first electrode 20 serves, for example, as an anode or cathode of the optoelectronic layer structure. The second electrode 23 serves, in a corresponding manner to the first electrode, as a cathode or anode of the optoelectronic layer structure.

The optoelectronic layer structure is an electrically and/or optically active region. The active region is, for example, the region of the optoelectronic component 10 in which electrical current for the operation of the optoelectronic component 10 flows and/or in which electromagnetic radiation is generated or absorbed. A getter structure (not shown) may be disposed on or atop the active region. The getter layer may be translucent, transparent or opaque. The getter layer may include or be formed from a material that absorbs and binds substances that are harmful to the active region.

An encapsulation layer 24 of the optoelectronic layer structure which is formed atop the second electrode 23 and partly atop the first contact section 16 and partly atop the second contact section 18 encapsulates the optoelectronic layer structure. The encapsulation layer 24 may take the form of a second barrier layer, for example of a second thin barrier layer. The encapsulation layer 24 may also be referred to as thin-layer encapsulation. The encapsulation layer 24 forms a barrier to chemical impurities or atmospheric substances, especially to water (moisture) and oxygen. The encapsulation layer 24 may take the form of a single layer, a layer stack or a layer structure. The encapsulation layer 24 may include or be formed from: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, poly(p-phenyleneterephthalamide), nylon-6,6, and mixtures and alloys thereof. The first barrier layer on the carrier 12 may optionally correspond to a configuration of the encapsulation layer 24.

In the encapsulation layer 24, a first recess of the encapsulation layer 24 is formed atop the first contact section 16, and a second recess of the encapsulation layer 24 atop the second contact section 18. In the first recess of the encapsulation layer 24 a first contact region 32 is exposed, and in the second recess of the encapsulation layer 24 a second contact region 34 is exposed. The first contact region 32 serves to form electrical contacts with the first contact section 16, and the second contact region 34 serves to form electrical contacts with the second contact section 18.

Figure 2:
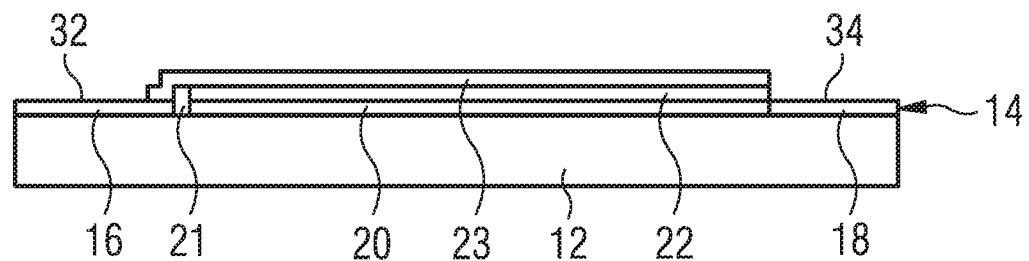
FIG. 2 shows a lateral section diagram of a first state during an illustrative process for producing the optoelectronic component.

FIG. 2 shows a lateral section diagram of a first state during an illustrative process for producing an optoelectronic component which may, for example, largely correspond to the optoelectronic component 10 shown in FIG. 1. In the state shown in FIG. 2, the substrate, the organic functional layer structure 22 atop the first electrode 20 and the second electrode 23 atop the organic functional layer structure have already been formed.

Figure 3:
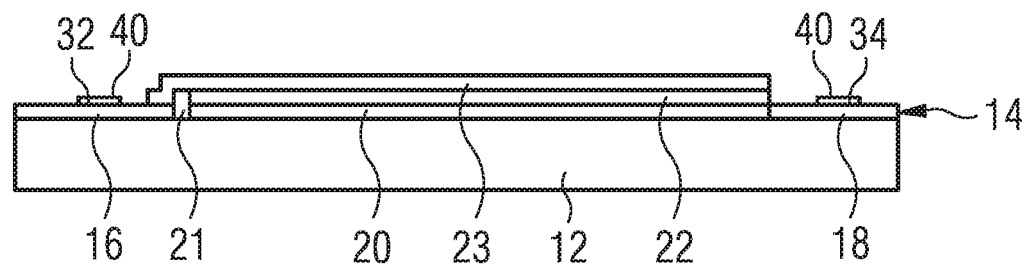
FIG. 3 shows a lateral section diagram of a second state during the process for producing the optoelectronic component.

FIG. 3 shows a lateral section diagram of a second state during the process for producing the optoelectronic component 10. In the second state, a protective layer 40 has been formed in the first contact region 32 atop the first contact section 16, and a protective layer 40 in the second contact region 34 atop the second contact section 18. In this working example, the protective layer 40 is formed by a self-assembled monolayer (SAM). Alternatively, the protective layer 40 may also be formed by another type of layer. The protective layer 40 is applied only to the subregions of the contact sections 16, 18 that are not to be ALD-coated, such that the remainder of the optoelectronic component 10 can subsequently be coated by ALD and hence encapsulated in a thin film.

The self-assembled monolayer may in principle be formed by application of an appropriate solution or suspension containing a suitable substance in the appropriate subregions in the contact sections 16, 18. Suitable substances are, for example, alkanethiols, alkyltrichlorosilanes and fatty acids. These form simple monolayers with high internal order on metals such as gold, silver, platinum and copper, and also graphite and silicon. The application of the protective layer 40 to the contact sections 16, 18 can be effected in a structured manner for example, more particularly by controlled printing, for example by inkjet printing. Alternatively, through suitable choice of SAM head groups of the molecules of the material of the protective layer 40 and corresponding configuration of the contact sections 16, 18, especially through suitable selection of the material of the contact sections 16, 18, selective coating of the metal contacts can be enabled. In this case, the entire optoelectronic component 10, if completed, can be coated in an unstructured manner per se with the material of the protective layer 40, for example from the gas phase, and the protective layer 40 is nevertheless applied in a structured manner since it adheres only in the regions intended for the purpose, especially the contact sections 16, 18, at least in the subregions of the contact sections 16, 18.

The protective layer 40 is intended to subsequently prevent the formation of the encapsulation layer 24 by ALD coating. Particularly useful substances for this purpose are SAMs with hydrophobic end groups, which render the corresponding subregion of the contact section 16, 18 water-repellent. For example, coating by means of ALD for formation of an encapsulation layer 24 of $Al_2O_3$ or $ZrO_2$ thereon is reliant on the surface to be coated having OH groups, or on water molecules being able to be adsorbed on the surface to be coated in a first ALD pulse. The suitable SAMs prevent this for the subregions of the contact sections 16, 18.

Incidentally, the subregions of the contact sections 16, 18 that have been kept clear in this way can subsequently be clearly distinguished in an appropriate analysis, for example an SEM analysis, from a contact section 16, 18 that has been cleared by scraping or a laser-ablated contact section 16, 18.

Figure 4:
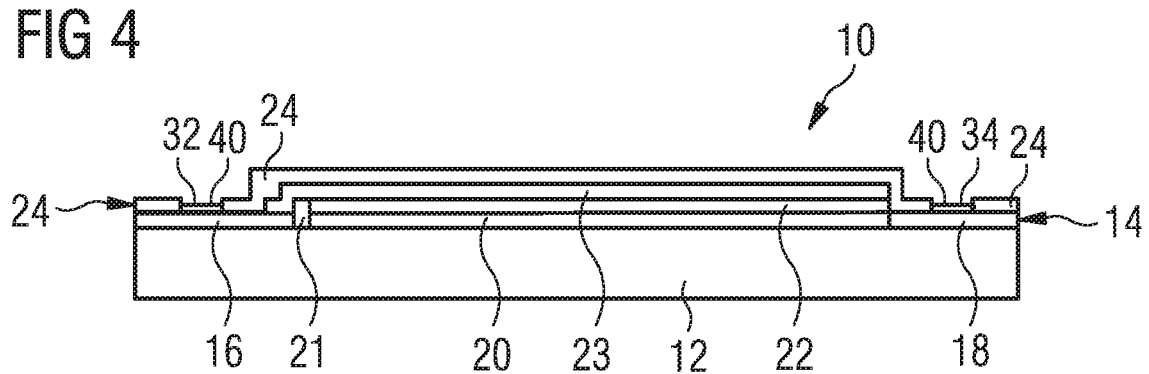
FIG. 4 shows a lateral section diagram of a third state during the process for producing the optoelectronic component.

FIG. 4 shows a lateral section diagram of a third state during the process for producing the optoelectronic component 10. More particularly, FIG. 4 shows the optoelectronic component 10 immediately after the formation of the encapsulation layer 24, the protective layer 40 being free of the encapsulation layer 24. More particularly, after the ALD coating of the OLED component, the SAM-treated subregions of the contact sections 16, 18 are free of the thin-film encapsulation without any need to expose them beforehand. Therefore, the subregions of the contact sections 16, 18 automatically remain uncoated during the formation of the encapsulation layer 24, especially during the ALD process, and electrical contacts can be formed therewith without a costly and inconvenient downstream laser ablation step and without clearing them by scraping. This enables component architectures for the optoelectronic component 10 where selective ablation of the encapsulation layer 24 from the corresponding contact section 16, 18 is possible only with difficulty, if at all, as is the case, for example, with Al contact sections applied by thermal vapor deposition.

By means of the ALD process, it is possible in principle to produce very thin, functional layers in a reproducible manner. In the ALD process, for production of the encapsulation layer, the starting materials needed for the purpose, also called precursors, are not supplied simultaneously to the substrate to be coated but in alternating succession in a coating chamber, also referred to as reactor. The starting materials may be deposited in an alternating manner on the surface of the substrate to be coated or on the starting material deposited beforehand and hence enter into a chemical bond. This makes it possible, for every cycle repetition, i.e. the supply of the necessary starting materials in downstream component steps, to grow a maximum of one monolayer of the layer to be applied in each case. By means of the number of cycles, good control of the layer thickness is possible. The starting material supplied at first accumulates only on the surface to be coated, and only the second starting material supplied thereafter can enter into chemical reactions with the first starting material. The chemical reactions of the starting materials are limited by means of the number of coreactants at the surface, i.e. self-limited.

A similar self-limiting surface reaction can be employed for the formation of organic films, for example polymer films, for example polyamide. This formation of organic films can be described as a molecular layer deposition (MLD) process, since a portion of a molecule is applied to the surface in each cycle. The MLD process is also suitable for forming the encapsulation layer 24. The MLD precursors may include homobifunctional reactants. In other words, the starting materials may each have two identical functional groups. A self-terminating MLD reaction for every layer may be formed with heterobifunctional reactants, meaning that each starting material may have two different functional groups. One of the functional groups may react with the chemical group on the surface and the other may not. The heterobifunctional reactants may as a result be merely monofunctional and hence prevent a double reaction with one another that could lead, for example, to termination of the polymer chain.

By means of ALD and MLD, it is possible to enable very consistent layer growth, and it is also possible to homogeneously cover surfaces with a large aspect ratio.

A selection of substances as ALD precursor, which should not be considered to be restrictive, is shown, for example, in the table which follows:

| First precursor | Second precursor | Resulting compound |
| --- | --- | --- |
| Trimethylaluminum (Al(CH$_3$)$_3$ - TMA) | H$_2$O; ethylene glycol; O$_3$; O$_2$ plasma, OH groups | Alucone (Al$_2$O$_3$) |
| BBr$_3$ | H$_2$O | B$_2$O$_3$ |
| Tris(dimethylamino) silane | H$_2$O$_2$ | SiO$_2$ |
| Cd(CH$_3$)$_2$ | H$_2$S | CdS |
| Hf[N(Me$_2$)]$_4$ | H$_2$O | HfO$_2$ |
| Pd(hfac)$_2$ | H$_2$; H$_2$ Plasma | Pd |
| MeCpPtMe$_3$ | O$_2$ plasma | PtO$_2$ |
| MeCpPtMe$_3$ | O$_2$ plasma; O2 plasma + H2 | Pt |
| Si(NCO)$_4$; SiCl$_4$ | H$_2$O | SiO$_2$ |
| TDMASn | H$_2$O$_2$ | SnO$_2$ |
| C$_{12}$H$_{26}$N$_2$Sn | H$_2$O$_2$ | SnO$_x$ |
| TaCl$_5$ | H$_2$O | Ta$_2$O$_5$ |
| Ta[N(CH$_3$)$_2$]$_5$ | O$_2$ plasma | Ta$_2$O$_5$ |
| TaCl$_5$ | H plasma | Ta |
| TiCl$_4$ | H plasma | Ta |
| Ti[OCH(CH$_3$)]$_4$; TiCl$_4$ | H$_2$O | TiO$_2$ |
| VO(OC$_3$H$_9$)$_3$ | O$_2$ | V$_2$O$_5$ |
| Zn(CH$_2$CH$_3$)$_2$ | H$_2$o; H$_2$O$_2$ | ZnO |
| Zr(N(CH$_3$)$_2$)$_4$)$_2$ | H$_2$O | ZrO$_2$ |
| Bis(ethylcyclopentadienyl)magnesium | H$_2$O | MgO |
| Tris(diethylamido)(tert-butylimido)tantalum | N$_2$H$_4$ | TaN |

A selection of substances as MLD precursor, which should not be considered to be restrictive, is shown, for example, in the table which follows:

| First precursor | Second precursor | Resulting compound |
| --- | --- | --- |
| p-Phenylenediamine | Terephthaloyl chloride | Poly(p-phenylene terephthalamide) |
| Hexane-1,6-diamine | C$_6$H$_8$Cl$_2$O$_2$ (adipoyl chloride) | Nylon-6,6 |

Optionally, the encapsulation layer 24 may include or be formed from one, two or more layer stacks of different layers one on top of another, for example a layer stack having the layer sequence of ALD layer/buffer layer or ALD layer/buffer layer/ALD layer. The buffer layer may be deposited in an unstructured manner by means of CVD, for example, such that the contact sections 16, 18 are first covered and subsequently structured, such that the contact sections 16, 18 are no longer covered. In other words, the buffer layer can first be deposited, inter alia, on the contact sections 16, 18 and then the contact sections 16, 18 can be exposed again. Alternatively, the buffer layer can also be applied in a structured manner, for example in a printing process, for example by means of inkjet printing, in such a way that the contact sections 16, 18 remain free from the material of the buffer layer. The buffer layer may include or be formed from a polymer, for example.

If the buffer layer is applied in a structured manner, it may be applied exclusively on the optically active surface or so as to extend only slightly beyond it. More particularly, it is thus possible for lateral side flanks of the buffer layer to be covered by the material of the ALD layers. This may be provided e.g. when the buffer layer consists of a polymer, since it can then be water-conducting. By contrast, in the case of application of the buffer layer over the full area, water and/or oxygen could penetrate laterally from the edges.

Figure 5:
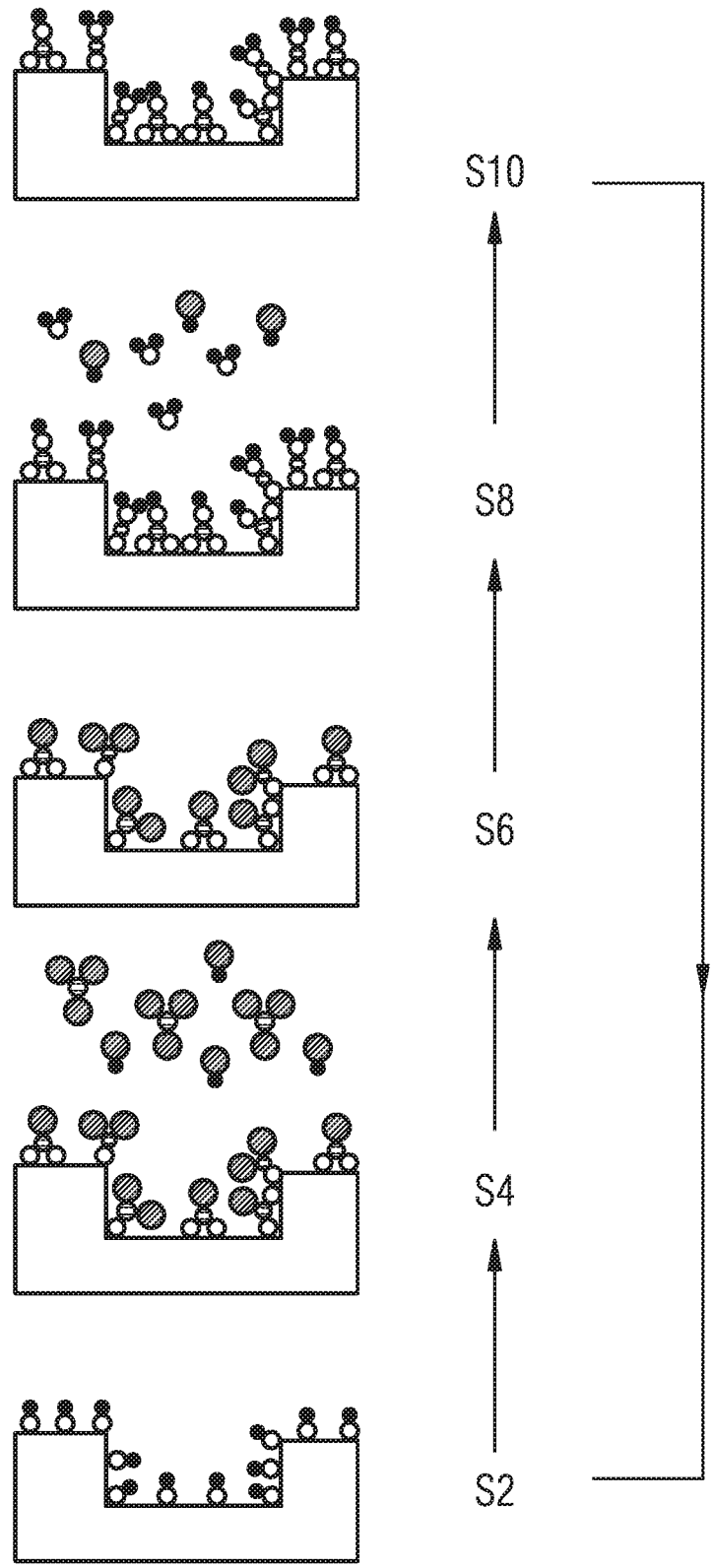
FIG. 5 shows a working example of a molecule.

FIG. 5 shows an illustrative procedure for an ALD process, for example an ALD process for production of the encapsulation layer 24, wherein formation of the encapsulation layer 24 on the subregions of the contact sections 16, 18 is prevented owing to a water-repellent property of the protective layer 40 and the appropriate SAMs.

In S2, a surface to which the encapsulation layer is to be applied, especially surfaces of the contact sections 16, 18 and of the second electrode 23, is prepared.

In S4, a first precursor is supplied in the gas phase, for example Al(CH$_3$)$_3$, and accumulates on the prepared surface, but not on the protective layer 40 that has a repellent effect on the first precursor. Moreover, a by-product, for example CH$_4$, can also be supplied in step S4, and this may also accumulate on the water molecules, but not on the protective layer 40.

In S6, a cleaning operation is effected, during which superfluous molecules of the first precursor are removed.

In S8, a second precursor is supplied in the gas phase, for example H$_2$O in the form of water vapor, and accumulates on the molecules of the first precursor, although the corresponding water molecules do not accumulate on the protective layer 40.

In S10, a cleaning operation is effected, during which superfluous molecules of the second precursor are removed.

Figure 6:
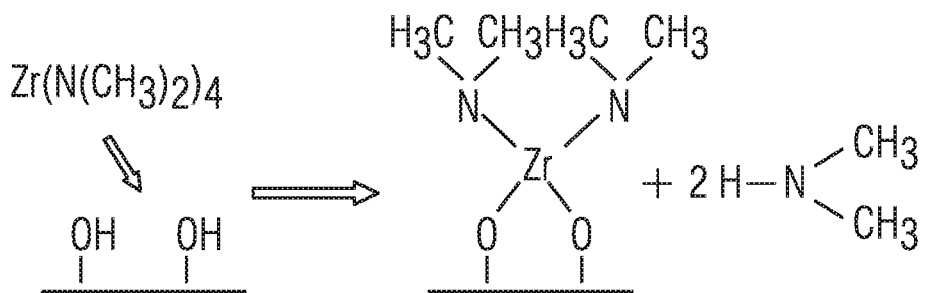
FIG. 6 shows an illustrative procedure for an ALD process.

FIG. 6 shows a schematic elucidation of a first partial process of an ALD process, for example of an ALD process for production of the encapsulation layer 24, wherein formation of the encapsulation layer 24 on the subregions of the contact sections 16, 18 is prevented owing to a water-repellent property of the protective layer 40 and the corresponding SAMs. In the first partial process, the first precursor couples to the OH groups on the prepared surface, but not to the surface of the protective layer 40.

Figure 7:
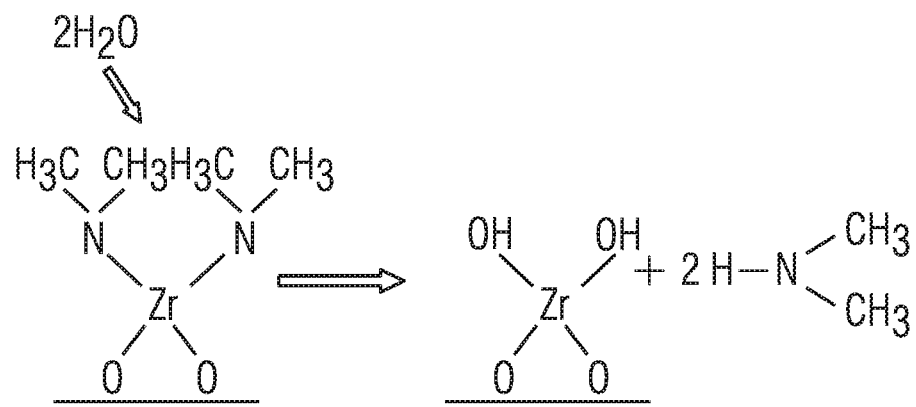
FIG. 7 shows a schematic elucidation of formation of a working example of a protective layer.

FIG. 7 shows a schematic elucidation of a second partial process of the ALD process according to FIG. 6. In the second partial process, the second precursor, especially water, couples onto the molecules of the first precursor.

Figure 8:
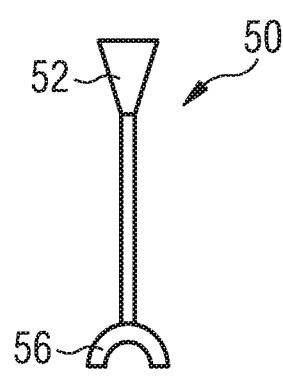
FIG. 8 shows a working example of a molecule.

FIG. 8 shows a working example of a molecule 50. By means of such molecules 50, the protective layer 40 can be formed. The molecule 50 has a head group 52 and an anchor group 56 covalently bonded to the head group 52.

The head group 52 is a hydrocarbyl group. In one embodiment, the head group 52 does not have any hydrophilic groups, for example hydroxyl, thiol, amine or carboxyl radicals, i.e. is hydrophobic. In a further embodiment, the head group 52 additionally does not comprise any heteroatoms, for example O, S and N.

For instance, the head group 52 may be a substituted or unsubstituted, branched or unbranched alkyl group having 1 to 30 carbon atoms, e.g. 2 to 20 carbon atoms, e.g. 3 to 15 carbon atoms; a substituted or unsubstituted, branched or unbranched alkenyl or alkynyl group having 2 to 30 carbon atoms, e.g. 3 to 20 carbon atoms, e.g. 4 to 15 carbon atoms; a substituted or unsubstituted (poly)cyclic alkyl or alkenyl group having 3 to 14 carbon atoms, e.g. 5 to 8 carbon atoms; a substituted or unsubstituted aryl group having 6 carbon atoms, where the aryl group may optionally be fused (condensed) to one or more further aryl group(s); or a substituted or unsubstituted arylalk(en/yn)yl group or a substituted or unsubstituted alk(en/yn)ylaryl group, where aryl, alkyl, alkenyl and alkynyl groups are as defined above. The substituents of the aforementioned groups are independently selected at each instance from the group consisting of Br, Cl, I, F, and the pseudohalogens —CN, —N$_3$, —OCN, —NCO, —CNO, —SCN, —NCS and —SeCN. In some embodiments, the substituents are selected from the group consisting of Br, Cl, I, and F.

Illustrative, nonlimiting embodiments of the aforementioned groups in this context include methyl, ethyl, n-propyl, n-butyl, n-pentyl and n-hexyl for unbranched alkyl groups; isopropyl, isobutyl, sec-butyl, tert-butyl, 2-pentyl, 3-pentyl, isopentyl and neopentyl for branched alkyl groups; vinyl and allyl for unbranched alkenyl groups; isobutenyl and isopentenyl for branched alkenyl groups; ethynyl, 1-propynyl, 3-propynyl, 1-butyn-1-yl and 2-butyn-1-yl for unbranched alkynyl groups; 2-pentyn-4-yl and 2-hexyn-5-yl for branched alkynyl groups; cyclopropane, cyclobutane, cyclopentane and cyclohexane for cyclic alkyl groups; norbornane and bicyclo[2.2.2]octane for polycyclic alkyl groups; cyclobutadiene, cyclopentene and cyclopentadiene for cyclic alkenyl groups; 2-norbornene and bicyclo[2.2.2]oct-2-ene for polycyclic alkenyl groups; phenyl for aryl groups and naphthalenyl, anthracenyl and phenanthrenyl for fused (condensed) aryl groups. The head group 52 may especially be perfluorinated, in order to further increase the hydrophobic effect.

By virtue of the choice of a certain minimum number of carbon atoms in the structure of the head group 52, especially of a certain minimum number of carbon atoms arranged in a linear manner in the structure of the head group 52, it is possible to control and affect the degree of order in the protective layer 40 formed from the molecules 50.

In one embodiment, the head group 52 is accordingly a carbon group including at least one linear carbon chain. The at least one linear carbon chain may be an alkyl, alkenyl or alkynyl group as defined above, where the at least one linear carbon chain has a minimum length of 3, e.g. at least 4, e.g. at least 5 and e.g. especially at least 6 carbon atoms. The at least one linear carbon chain may be substituted or unsubstituted, as defined above. In addition to the at least one linear carbon chain, the head group 52 having a certain minimum number of carbon atoms may comprise at least one further nonlinear carbon group. The at least one nonlinear carbon group may be a (poly)cyclic alkyl or alkenyl group as defined above, or an aryl group as defined above, which may optionally be substituted as defined above.

In a further embodiment, the head group 52 is thus a substituted or unsubstituted linear alkyl, alkenyl or alkynyl group having at least 3 carbon atoms, e.g. at least 4 carbon atoms, e.g. at least 5 carbon atoms and e.g. at least 6 carbon atoms.

In a further embodiment, the head group 52 is a substituted or unsubstituted alkylaryl, alkenylaryl or alkynylaryl group, where the particular alkyl, alkenyl or alkynyl group is a substituted or unsubstituted linear alkyl, alkenyl or alkynyl group having at least 3 carbon atoms, e.g. at least 4 carbon atoms, e.g. at least 5 carbon atoms and e.g. at least 6 carbon atoms, and where the aryl group is as defined above.

In a further embodiment, the head group 52 is a substituted or unsubstituted arylalkyl, arylalkenyl or arylalkynyl group, where the particular alkyl, alkenyl or alkynyl group is a substituted or unsubstituted linear alkyl, alkenyl or alkynyl group having at least 3 carbon atoms, e.g. at least 4 carbon atoms, e.g. at least 5 carbon atoms and e.g. at least 6 carbon atoms, and where the aryl group is as defined above.

In some embodiments, the head group 52 includes at least one linear carbon chain, as defined above, having a total length of at least 7, e.g. at least 8, e.g. at least 9 carbon atoms.

In a further embodiment, the head group 52 is defined by the formula —C$_8$H$_{16}$CF$_3$.

The anchor group 56 is the functional portion of the molecule 50 that is capable of being adsorbed onto the surface to which the molecules according to various embodiments are applied. According to various embodiments, the anchor group 56 thus includes at least one chemical group capable of entering into a bond with metal atoms of the respective contact section via adsorption processes, such that the individual molecules 50 of the protective layer are bound via their respective head group 56 on the surface of the contact section.

Nonlimiting examples in this connection include carboxyl groups that bind to a nickel or titanium contact section, nitrile groups that bind to a silver contact section, thiol groups that bind to a silver, gold, chromium or copper contact section, amine groups that bind to a copper contact section, or phosphoric acid groups that bind to an aluminum or ITO contact section. In some embodiments, the anchor group 56 includes at least one of the aforementioned groups. In some embodiments, the anchor group 56 includes at least two of the aforementioned groups, where these are localized not more than 2 carbon atoms apart from one another in the molecule 50 and the head group 52 should be chosen correspondingly as defined herein.

In one embodiment, the head group 52 of the molecule 50 is defined by the formula —C$_8$H$_{16}$CF$_3$ and the anchor group 56 is defined by the formula —SH, and so the molecule 50 is defined by the formula SHC$_8$H$_{16}$CF$_3$.

In another embodiment, the head group 52 of the molecule 50 is defined by the formula —C$_8$H$_{16}$CF$_3$ and the anchor group 56 is defined by the formula —COOH, and so the molecule 50 is defined by the formula COOHC$_8$H$_{16}$CF$_3$.

If the optoelectronic component 10 is such that the head group 56 binds exclusively to the contact section 16, 18, and does not bind to any other exposed layer of the optoelectronic component 10, the protective layer 40 as elucidated hereinabove can be applied in structured form per se, for example from the gas phase, and is nevertheless ultimately applied in structured form since the material of the protective layer 40 automatically selectively binds exclusively at the contact section 16, 18.

Figure 9:
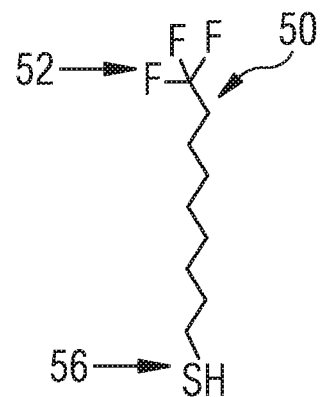
FIG. 9 shows a working example of a molecule.

FIG. 9 shows a working example of a molecule 50. By means of molecules 50 of this kind, the protective layer 40 can be formed. The molecule 50 has the head group 52 and the anchor group 56. The anchor group 52 includes C$_8$H$_{16}$CF$_3$, which is hydrophobic. The head group includes SH, which selectively binds to chromium. If the contact sections 16, 18 or at least the subregion of the contact sections 16, 18 are formed from chromium, these molecules 50 will accumulate exclusively at the contact sections 16, 18, e.g. in the subregions of the contact section 16, 18.

Various embodiments provide a process for producing an optoelectronic component which is performable in a simple and/or inexpensive manner and/or which contributes to reliable operability of the optoelectronic component.

Various embodiments provide an optoelectronic component which is producible in a simple and/or inexpensive manner and/or which is reliably operable.

Various embodiments provide a process for producing an optoelectronic component, in which: a first electrode and at least one contact section are formed atop a carrier; an optically functional layer structure is formed atop the first electrode; a second electrode is formed atop the optically functional layer structure, the first electrode or the second electrode being electrically connected to the contact section; a protective layer is applied to at least a subregion of the contact section, the protective layer being formed by a material which is repellent to a substance for production of an encapsulation layer, and the encapsulation layer is formed atop the second electrode and atop the contact section, the subregion remaining free of the encapsulation layer because of the protective layer.

The protective layer is applied atop the subregion or atop the entire contact section. The protective layer prevents the encapsulation layer from forming atop the contact section, especially the subregion of the contact section. The effect of this is that the contact section, and at least the subregion of the contact section, remains free of the encapsulation layer. The effect of this is that there is no longer any need to subsequently remove the encapsulation layer from the contact section, especially from the subregion of the contact section. The effect of this is that it is possible to dispense with the process step for removing the encapsulation layer atop the contact section, and that the corresponding electrode cannot be damaged in the region of the contact section. The effect of this is that the optoelectronic component is producible in a simple and inexpensive manner, and that, because of the lack of damage to the electrode, the optoelectronic component is very unlikely to fail and can therefore be operated reliably.

In one development, the substance for production of the encapsulation layer is a precursor which is required for the production of the encapsulation layer. In the case of a synthesis route, a precursor refers to a molecule which enters into a reaction as starting material (reactant). This forms, usually with involvement of one, two or more further precursors, a complex and differentiated product, namely the encapsulation layer. The synthesis route in this context is the production of the encapsulation layer. Since the protective layer is repellent to the precursor, the precursor cannot accumulate in the contact section, especially on the subregion of the contact section. This prevents, in a simple and effective manner, the formation of the encapsulation layer atop the contact section, especially the subregion of the contact section.

In one development, the material of the protective layer is repellent to at least two precursors which are required for the production of the encapsulation layer. Since the protective layer is repellent to both precursors, the precursors cannot accumulate in the contact section, especially on the subregion of the contact section. This prevents, in a simple and effective manner, the formation of the encapsulation layer atop the contact section, especially the subregion of the contact section.

In one development, the encapsulation layer is formed by means of an ALD process or an MLD process. The ALD (atomic layer deposition) process is a highly modified CVD (chemical vapor deposition) process for depositing thin layers by means of two or more cyclically conducted self-limiting surface reactions. The layers generally have a polycrystalline or amorphous structure. For monocrystalline (epitaxial) layers, the process is also known by the name of atomic layer epitaxy (ALE). If molecular fragments rather than individual atoms from the precursor molecules are being deposited in a self-limiting reaction, this is referred to as molecular layer deposition (MLD). Both the ALD process and the MLD process enable production of a very thin and simultaneously very stable and highly dense encapsulation layer.

In one development, the protective layer is applied in structured form in the subregion. The fact that the protective layer is applied in structured form means in this connection that it is applied directly in its ultimate structure in the contact section, especially the subregion of the contact section. By contrast, in the case of unstructured application of the protective layer, it is first applied over a large area and subsequently structured, in which case it is necessary to remove the protective layer in the regions in which it is not wanted in a process step specially provided for the purpose. The effect of the structured application of the protective layer is that the protective layer need not subsequently be removed in regions in which it is not wanted, which means that it is possible to dispense with a corresponding process step.

In one development, the materials of the protective layer and of the contact section are such that the material of the protective layer accumulates exclusively in the contact section. More particularly, the material of the protective layer, in a manner corresponding to the material of the contact section, especially of the subregion of the contact section, and the surfaces and materials adjoining the contact section, is chosen such that it accumulates exclusively in the contact section, especially the subregion of the contact section. In this context, the fact that the material of the protective layer accumulates exclusively in the contact section means that it does not accumulate at surfaces of other materials of the optoelectronic component with which it comes into contact in the forming of the protective layer. For example, the contact section includes or is formed from chromium, nickel or ITO. This can contribute to accumulation of the protective layer solely in the contact section. The effect of this is that the material of the protective layer can be applied to the corresponding surfaces without any great respect to its later structure and is nevertheless applied in a structured manner, since the material of the protective layer adheres only in the regions intended for the purpose, especially the contact section, especially the subregion of the contact section. This can contribute to producibility of the protective layer in a particularly simple and inexpensive manner. Alternatively, the protective layer can be applied in a structured manner by means of a printing method, for example by means of inkjet printing.

In one development, the protective layer takes the form of a self-assembled monolayer. The self-assembled monolayer (SAM) is also referred to hereinafter as SAM for short. The SAM functionalizes a surface of the contact section, especially of the subregion of the contact section, in such a way that at least one substance which is needed for formation of the encapsulation layer cannot accumulate on the surface of the contact section. Therefore, the encapsulation layer is not formed in this region. Alternatively, the protective layer may also be formed by a different layer structure.

Various embodiments provide an optoelectronic component, having: the first electrode and the at least one contact section atop the carrier; the optically functional layer structure atop the first electrode; the second electrode atop the optically functional layer structure, the first electrode or the second electrode being electrically connected to the contact section; the protective layer on at least the subregion of the contact section, the protective layer being formed by the material which is repellent to a substance for production of the encapsulation layer; and the encapsulation layer atop the second electrode, the subregion being free of the encapsulation layer.

The developments and advantages elucidated hereinabove in connection with the process for producing the optoelectronic component can be applied directly to the optoelectronic component.

In one development, the substance for production of the encapsulation layer is the precursor.

In one development, the material of the protective layer is repellent to at least two precursors.

In one development, the encapsulation layer is formed by means of an ALD process or an MLD process.

In one development, the protective layer is formed exclusively in the subregion.

In one development, the materials of the protective layer and of the contact section are such that the material of the protective layer accumulates exclusively in the contact section. For example, the contact section includes or is formed from chromium, nickel or ITO.

In one development, the protective layer is a self-assembled monolayer.

Various embodiments provide a protective layer on a contact section for forming electrical contacts with the electronic or optoelectronic component, the protective layer being formed by a material which is repellent to a substance for production of an encapsulation layer for encapsulation of the electronic or optoelectronic component.

The developments and effects elucidated hereinabove in connection with the process for producing the optoelectronic component can be applied directly to the protective layer.

LIST OF REFERENCE SIGNS

Optoelectronic component 10
Carrier 12
Electrically conductive layer 14
First contact section 16
Second contact section 18
First electrode 20
Organic functional layer structure 22
Second electrode 23
Encapsulation layer 24
First contact region 32
Second contact region 34
Adhesion promoter layer 36
Covering body 38
Protective layer 40
Molecule 50
Anchor group 52
Spacer 54
Head group 56

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An optoelectronic component, comprising:
a first electrode;
an electrically conductive layer comprising at least one first contact section and at least one second contact section atop a carrier;
an optically functional layer structure atop the first electrode;
a second electrode atop the optically functional layer structure, the first electrode being electrically connected to the at least one first contact section and the second electrode being electrically connected to the at least one second contact section;
a protective layer comprising a self-assembled monolayer (SAM) on at least one subregion of the at least one first contact section and/or the at least one second contact sections; and
an encapsulation layer atop the second electrode; and
wherein the protective layer consists of a material repellent to a substance of the encapsulation layer;
wherein at least one subregion is free of the encapsulation layer;
wherein the surfaces of the at least one first contact section and the at least one second contact section facing away from the carrier are completely covered by the encapsulation layer and the protective layer and/or a top most surface of the optoelectronic component is completely covered by the encapsulation layer and the protective layer;
wherein the carrier, the encapsulation layer, and the at least one first contact section and/or the at least one second contact section terminate flush on at least one lateral surface; and
wherein the encapsulation layer is an at least one-layer stack that has a layer sequence of an ALD layer/a buffer layer/ALD layer,
wherein the buffer layer is formed from a polymer,
wherein the buffer layer is applied exclusively on an optically active surface of the optically functional layer structure, and
wherein lateral side flanks of the buffer layer are covered by the material of the ALD layers.

2. The optoelectronic component of claim 1, wherein the substance for production of the encapsulation layer is a precursor which is required for production of the encapsulation layer.

3. The optoelectronic component of claim 2, wherein the material of the protective layer is repellent to at least two precursors that are required for production of the encapsulation layer.

4. The optoelectronic component of claim 1, wherein the protective layer is formed exclusively in the subregion.

5. The optoelectronic component of claim 4, wherein the materials of the protective layer and of the at least one first contact section and the at least one second contact section are such that the material of the protective layer accumulates exclusively in the first and second contact sections.

6. The optoelectronic component of claim 1, wherein the protective layer is a self-assembled monolayer.

7. The optoelectronic component of claim 1, wherein surfaces of the at least one first contact section and the at least one second contact section facing away from the carrier are completely covered.

8. The optoelectronic component of claim 1, wherein the protective layer is permanently applied to the at least one subregion.

9. The optoelectronic component of claim 1, wherein the protective layer comprises molecules having a head group and an anchor group where the anchor group is adsorbed onto a surface of the at least one first contact section or the at least one second contact section, wherein the head group consists of a hydrocarbyl group selected from the group consisting of a substituted or unsubstituted, branched or unbranched, alkyl group, a substituted or unsubstituted, branched or unbranched, alkenyl or alkynyl group, a substituted or unsubstituted, (poly)cyclic alkyl or alkenyl group, a substituted or unsubstituted, aryl group, a substituted or unsubstituted, arylalk(en/yn)yl group, a substituted or unsubstituted alk(en/yn)ylaryl group, and combinations thereof; wherein the anchor group consists of a hydrophilic group selected from the group consisting of a carboxyl group, a nitrile group, a thiol group, an amine group, a phosphoric acid group, and combinations thereof.

10. The optoelectronic component of claim 1, wherein the protective layer consists of a compound selected from the group consisting of $COOHC_8H_{16}CF_3$ or $HSC_8H_{16}CF_3$.

11. The optoelectronic component of claim 1, wherein the at least one subregion of the at least one first contact section is arranged laterally adjacent to the first electrode, and wherein the subregion of the at least one second contact section is arranged laterally adjacent to the second electrode.

12. The optoelectronic component of claim 1, wherein the protective layer comprising the SAM does not directly contact the first electrode or the second electrode.

13. The optoelectronic component of claim 1, wherein the at least one second contact section is electrically insulated from the first electrode.

14. The optoelectronic component of claim 1, wherein the at least one subregion is a subregion of the at least one first contact section and is arranged laterally adjacent to the first electrode, and wherein the at least one subregion is a subregion of the at least one second contact section and is arranged laterally adjacent to the second electrode.

15. The optoelectronic component of claim 1, wherein the protective layer comprising the SAM does not directly contact the first electrode or the second electrode.

16. The optoelectronic component of claim 1, wherein the at least one second contact section is electrically insulated from the first electrode.

* * * * *